(12) United States Patent
Bito et al.

(10) Patent No.: US 8,580,913 B2
(45) Date of Patent: *Nov. 12, 2013

(54) POLYIMIDE RESIN

(75) Inventors: Tsuyoshi Bito, Kanagawa (JP); Shuta Kihara, Kanagawa (JP); Jitsuo Oishi, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 802 days.

This patent is subject to a terminal disclaimer.

(21) Appl. No.: 12/307,784

(22) PCT Filed: Jul. 5, 2007

(86) PCT No.: PCT/JP2007/063447
§ 371 (c)(1),
(2), (4) Date: Jan. 7, 2009

(87) PCT Pub. No.: WO2008/004615
PCT Pub. Date: Jan. 10, 2008

(65) Prior Publication Data
US 2009/0291259 A1  Nov. 26, 2009

(30) Foreign Application Priority Data
Jul. 7, 2006 (JP) ................... 2006-187980

(51) Int. Cl.
*C08G 73/10* (2006.01)
(52) U.S. Cl.
USPC ........... 528/353; 428/458; 528/125; 528/126; 528/310; 528/335; 528/336
(58) Field of Classification Search
USPC ......... 528/353, 269, 335, 336, 125, 126, 310; 428/458
See application file for complete search history.

(56) References Cited

U.S. PATENT DOCUMENTS

| | | | |
|---|---|---|---|
| 3,639,343 A | | 2/1972 | Su et al. |
| 7,078,477 B2* | | 7/2006 | Oguro et al. ................. 528/336 |
| 7,217,462 B2 | | 5/2007 | Kihara et al. |
| 8,110,652 B2* | | 2/2012 | Bito et al. ................. 528/353 |
| 2004/0026509 A1 | | 2/2004 | Reichenbach et al. |
| 2004/0266979 A1* | | 12/2004 | Oguro et al. ................. 528/336 |
| 2006/0142540 A1* | | 6/2006 | Deets et al. ................. 528/353 |
| 2006/0180908 A1* | | 8/2006 | Yano et al. ................. 257/678 |
| 2008/0085361 A1* | | 4/2008 | Satou et al. ................. 427/58 |

FOREIGN PATENT DOCUMENTS

| | | |
|---|---|---|
| EP | 1 514 888 A1 | 3/2005 |
| JP | 55-91895 | 7/1980 |
| JP | 05-032950 | 2/1993 |
| JP | 05-059344 | 3/1993 |
| JP | 2001-329246 | 11/2001 |
| JP | 2003-168800 | 6/2003 |
| JP | 2004-083875 | 3/2004 |
| JP | 2004-083885 | 3/2004 |
| JP | 2004-358961 | 12/2004 |
| JP | 2005-015629 | 1/2005 |
| WO | WO 2006/077964 A2 | 7/2006 |

* cited by examiner

*Primary Examiner* — Gregory Listvoyb
(74) *Attorney, Agent, or Firm* — Antonelli, Terry, Stout & Kraus, LLP.

(57) ABSTRACT

A polyimide resin which is satisfactory in solvent solubility and heat resistance, has a low coefficient of water absorption and is excellent in adhesive properties and a method for manufacturing the same, a film containing the subject polyimide resin and a metal-clad laminate including an adhesive layer composed of the subject polyimide resin are provided. The polyimide resin is a polyimide resin containing a molecule having a repeating unit represented by a structure of any one of the following formulae (1) to (3) in a specified proportion, whose molecular end is capped by an end-capping agent.

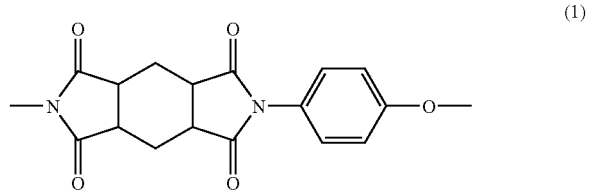

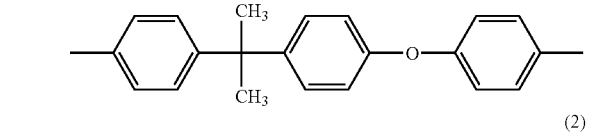

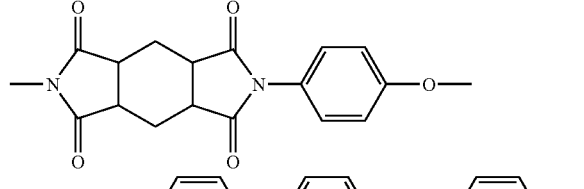

10 Claims, No Drawings

POLYIMIDE RESIN

TECHNICAL FIELD

The present invention relates to a polyimide resin exhibiting satisfactory solvent solubility and thermosetting properties, excellent adhesive properties, heat resistance and low water absorption properties, a film containing the subject polyimide resin, an adhesive composed of the subject polyimide resin and a metal-clad laminate using the subject adhesive. The subject metal-clad laminate is processed into a printed wiring board, a surface heating element, an electromagnetic shielding material, a flat cable, etc.

BACKGROUND TECHNOLOGY

A metal-clad laminate includes one which is manufactured by bonding an insulating base material and a metal layer to each other via an adhesive or an adhesive film. For example, there is proposed a metal-clad laminate of a three-layer structure in which an insulating base material composed of an aromatic polyimide resin film and a metal layer are bonded to each other via an adhesive film (see Patent Document 1).

Adhesives and adhesive films composed mainly an epoxy based or acrylic resin have hitherto been used as the adhesive or adhesive film. However, since such a resin is inferior in heat resistance, the heat resistance of a product after bonding becomes insufficient, whereby restrictions were generated in subsequent processing condition and use condition.

For that reason, adhesives and adhesive films which are excellent in heat resistance are required. For example, there are disclosed a method in which a solution of a polyimide resin or a polyamic acid is coated on an insulating base material, and the solvent removal and optionally, an imidation treatment are then carried out, thereby forming an adhesive layer with thermo-compression bonding properties; a method in which a solution of a polyimide resin or a polyamic acid is coated on a glass sheet, etc., and the solvent removal and optionally, an imidation treatment are then carried out, thereby forming an adhesive film with thermo-compression bonding properties; and a method in which an adherend such as a metal layer, etc. is subjected to thermo-compression bonding on the thus formed adhesive layer or adhesive film (see Patent Documents 2 and 3). The foregoing adhesive layer forming method is roughly classified into a method of using a solution of a polyimide resin and a method of using a polyamic acid solution.

In the method of using a polyamic acid solution, in order to form an adhesive layer or an adhesive film after coating a polyamic acid solution on an insulating base material or a glass sheet, an imidation process at a high temperature exceeding 300° C. must be carried out. The heat resistance of a metal-clad laminate which is formed while omitting the imidation process is conspicuously low. In the method of using a solution of a polyimide resin, after coating, it may be sufficient that the solvent is merely volatilized, and an adhesive layer or an adhesive film can be formed at a low temperature of up to about 200° C. Accordingly, the method of using a solution of a polyimide resin is advantageous in manufacturing a metal-clad laminate with high heat resistance. Most of conventional adhesive layers which are composed of a wholly aromatic polyimide resin were formed using a polyamic acid solution. In order to obtain a solution of a polyimide resin, a solvent-soluble polyimide resin is necessary.

On the other hand, in a metal-clad laminate, there was encountered a problem that when the amount of a residual volatile component of an adhesive layer to be disposed between an insulating base material and a metal layer is high, blanching, blister, foaming, etc. of the adhesive layer is caused during a soldering step reaching a high temperature of 250° C. or higher, thereby noticeably hindering adhesive properties between the insulating base material and the metal layer (see Patent Document 4). Examples of this residual volatile component of the adhesive layer include water and the solvent which have not been removed in imidation and solvent removal steps during the formation of an adhesive layer or an adhesive film; water to be absorbed from the manufacturing environment; water to be absorbed at the time of dipping in an aqueous solution in an etching step; and the like. Of these, water is especially regarded as a problem. In order to solve the foregoing problem, it is desirable to decrease a coefficient of water absorption which is an index of the water content of polyimide.

Also, there is disclosed a heat fusible polyimide resin containing 1,2,4,5-cyclohexanetetracarboxylic acid skeleton in a molecular main chain thereof, which is obtainable from 1,2,4,5-cyclohexanetetracarboxylic dianhydride or a reactive derivative thereof (see Patent Document 6). Example 1 thereof discloses a transparent, yellow polyimide resin film having a glass transition temperature of 304° C., which is obtained by reacting 1,2,4,5-cyclohexanetetracarboxylic dianhydride or a reactive derivative thereof with diaminodiphenylmethane to form an amic acid, which is then coated and subsequently heated for imidation, and this is further heat molded under a pressure. Also, Patent Document 5 discloses that a transparent, less colored polyimide resin film having a glass transition temperature of 300° C. or higher is obtainable from a polyimide resin solution which is obtained by using diaminodiphenyl ether.

The foregoing polyimide resin having a 1,2,4,5-cyclohexanetetracarboxylic acid skeleton is advantageous from the standpoint of film fabrication because a high molecular weight is relatively easily achieved, a flexible film is easily obtainable, and the solubility in a solvent is sufficiently large. Also, it is extremely useful because an adhesive layer which is flexible and which has sufficient thickness and durability can be easily formed upon being coated.

However, a polyimide resin film described in Patent Document 6 is formed through an imidation step at a high temperature similar to the conventional technology, and therefore, the film is colored. Also, the polyimide resin films described in Patent Documents 5 and 6 involved such a drawback that they are high in coefficient of water absorption and inferior in hygroscopic dimensional stability. There is also an example in which a polyimide resin having a 1,2,4,5-cyclohexanetetracarboxylic acid skeleton is applied to a metal-clad laminate (see Patent Document 7). This polyimide resin is solvent-soluble and is used as an adhesive layer of a metal-clad laminate. However, since the polyimide resin itself is thermoplastic, a metal-clad laminate in which only this polyimide resin is used as an adhesive layer had a difficult point in processability at a temperature exceeding a flow initiation temperature of this polyimide resin. Also, a further enhancement regarding its adhesive strength has been desired. Also, Patent Document 8 discloses a manufacturing method of a solvent-soluble polyimide by polycondensation of an aliphatic tetracarboxylic dianhydride, an aliphatic tetracarboxylic acid or a derivative thereof and a diamine compound in a solvent in the presence of a tertiary amine compound. However, since this polyimide is thermoplastic, too, when used in a metal-clad laminate, it causes the same difficult point.

[Patent Document 1] JP-A-55-91895
[Patent Document 2] JP-A-5-32950
[Patent Document 3] JP-A-5-59344
[Patent Document 4] JP-A-2001-329246
[Patent Document 5] JP-A-2003-168800
[Patent Document 6] U.S. Pat. No. 3,639,343
[Patent Document 7] JP-A-2005-1380
[Patent Document 8] JP-A-2005-15629

DISCLOSURE OF THE INVENTION

Problems that the Invention is to Solve

An object of the present invention is to solve the problems accompanied in the wholly aromatic polyimide resins which have hitherto been used in an adhesive layer and to provide a polyimide resin which, when used in an adhesive layer, is able to be manufactured by only the solvent removal without requiring an imidation step at a high temperature and is thermosetting, a cured material of which is excellent in adhesive properties, low in coefficient of water absorption and satisfactory in heat resistance and a method for manufacturing the same, a film containing the subject polyimide resin and a method for manufacturing the same, an adhesive composed of the subject polyimide resin, and a metal-clad laminate including an adhesive layer composed of the subject adhesive.

Means for Solving the Problems

Specifically, the present invention provides
(1) A polyimide resin containing at least one kind selected from the group consisting of a repeating unit represented by the following formula (1) and a repeating unit represented by the following formula (2):

wherein a proportion of the total sum of the repeating unit represented by the formula (1) and the repeating unit represented by the formula (2) is 50% by mole or more of the whole of the repeating units; and the polyimide resin contains a material obtained by reacting an end-capping component composed of at least one kind selected from the group consisting of a dicarboxylic anhydride consisting of 5-norbornene-2,3-dicarboxylic anhydride, citraconic anhydride and maleic anhydride on a molecular end thereof;

(2) A method for manufacturing a polyimide resin including a step of reacting at least one kind of a tetracarboxylic acid component (Y) selected from the group consisting of 1,2,4,5-cyclohexanetetracarboxylic acid, 1,2,4,5-cyclohexanetetracarboxylic dianhydride and a reactive derivative of 1,2,4,5-cyclohexanetetracarboxylic acid, a diamine component (Z) and at least one kind of an end-capping component (W) selected from the group consisting of a dicarboxylic anhydride consisting of 5-norbornene-2,3-dicarboxylic anhydride, citraconic anhydride and maleic anhydride, the polyimide resin containing at least one kind selected from the group consisting of a repeating unit represented by the formula (1) and a repeating unit represented by the formula (2), or at least one kind selected from the group consisting of a repeating unit represented by the formula (1) and a repeating

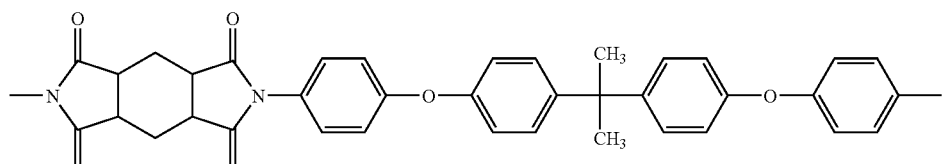

(1)

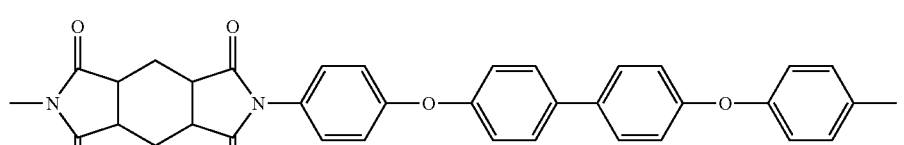

(2)

or a polyimide resin containing at least one kind selected from the group consisting of a repeating unit represented by the formula (1) and a repeating unit represented by the formula (2) and at least one kind of a repeating unit other than the repeating unit represented by the formula (1) or (2), which is represented by the following formula (3):

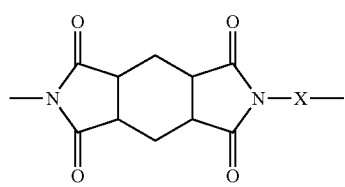

(3)

(in the formula, X represents a divalent aliphatic group having from 2 to 39 carbon atoms, a divalent alicyclic group having from 3 to 39 carbon atoms, a divalent aromatic group having from 6 to 39 carbon atoms or a divalent group composed of a combination thereof; at least one kind of a bonding group selected from the group consisting of —O—, —SO$_2$—, —CH$_2$—, —C(CH$_3$)$_2$—, —OSi(CH$_3$)$_2$—, —C$_2$H$_4$O— and —S— may intervene in a main chain of X; and X may have at least one kind of a functional group selected from the group consisting of a carboxyl group, a hydroxyl group and a carbonyl group), unit represented by the formula (2) and at least one kind of a repeating unit other than the repeating unit represented by the formula (1) or (2), which is represented by the formula (3), with a proportion of the total sum of the repeating unit represented by the formula (1) and the repeating unit represented by the formula (2) being 50% by mole or more of the whole of the repeating units, wherein the diamine component (Z) is composed of at least one kind selected from the following diamine component (Z1) and diamine component (Z2), or composed of at least one kind selected from the diamine component (Z1) and the diamine component (Z2) and a diamine component (Z3); and when the diamine component (Z) is a mixture, the total sum of use amount of the diamine component (Z1) and the diamine component (Z2) is 50% by mole or more of the total sum of all of the diamine components:

Diamine component (Z1): 2,2-bis[4-(4-aminophenoxy)phenyl]propane or a reactive derivative thereof as a diamine component capable of forming the repeating unit of the formula (1)

Diamine component (Z2): 4,4'-bis(4-aminophenoxy)biphenyl or a reactive derivative thereof as a diamine component capable of forming the repeating unit of the formula (2)

Diamine component (Z3): one or more kinds of a diamine represented by NH$_2$—X—NH$_2$ or a reactive derivative thereof as a diamine component capable of forming the repeating unit of the formula (3) (X is the same as defined above, provided that (Z3) is different from (Z1) and (Z2));
(3) An adhesive containing the polyimide resin as set forth above in (1);
(4) A polyimide resin film containing the polyimide resin as set forth above in (1);
(5) A method for manufacturing a polyimide resin film including the steps of casting a solution of the polyimide resin as set forth above in (1) on a support and evaporating and removing an organic solvent; and
(6) A metal-clad laminate including an insulating base material, a metal layer and an adhesive layer disposed between the subject insulating base material and the metal layer, wherein the subject laminate is formed of the polyimide resin as set forth above in (1) or the polyimide resin obtained by the manufacturing method as set forth above in (2).

Advantages of the Invention

The polyimide resin of the present invention is thermosetting and solvent-soluble, and a cured material thereof is excellent in adhesive properties, has a low coefficient of water absorption and has satisfactory heat resistance. Also, because of its solvent solubility, as to the manufacturing method thereof, solution polymerization is applicable, it may be sufficient that the solvent removal is merely carried out during the formation of an adhesive layer from the obtained polyimide resin solution, and a conventional imidation step at a high temperature reaching 300° C. or higher is not needed. The metal-clad laminate using the polyimide resin of the present invention is excellent in adhesive properties and soldering heat resistance.

BEST MODES FOR CARRYING OUT THE INVENTION

The present invention is hereunder described in detail.
The polyimide resin of the present invention (hereinafter properly referred to as "polyimide A") is characterized by a combination of specified repeating units and a specified end-capping structure. The polyimide A contains a repeating unit represented by the following formula (1):

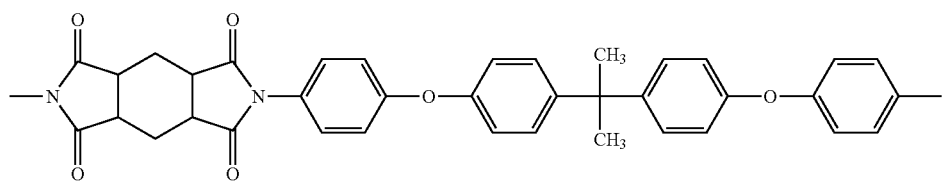

(1)

and/or a repeating unit represented by the following formula (2):

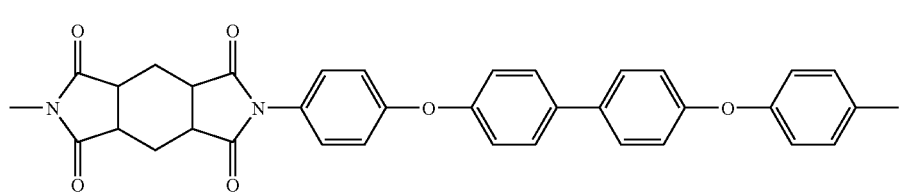

(2)

or the repeating unit represented by the formula (1) and/or the repeating unit represented by the formula (2) and at least one kind of a repeating unit other than the repeating unit represented by the formula (1) or (2), which is represented by the following formula (3):

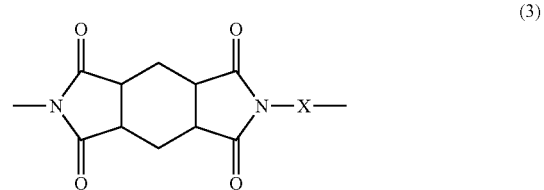

(3)

wherein a proportion of the total sum of the repeating unit represented by the formula (1) and the repeating unit represented by the formula (2) is 50% by mole or more of the whole of the repeating units, and from the standpoint of water absorption properties, it is preferably 70% by mole or more, and more preferably 80% by mole or more (all of which include 100% by mole). When the proportion of the repeating unit represented by the formula (1) or formula (2) is 50% by mole or more of the whole of the repeating units, low water absorption properties can be achieved. However, when it is less than 50% by mole, the coefficient of water absorption is high so that there is a possibility that the soldering heat resistance of a metal-clad laminated sheet using the subject polyimide as an adhesive is lowered. A molecular form may be any of a block copolymer or a random copolymer.

X in the formula (3) is one other than the repeating unit represented by the following formula (4) or (5):

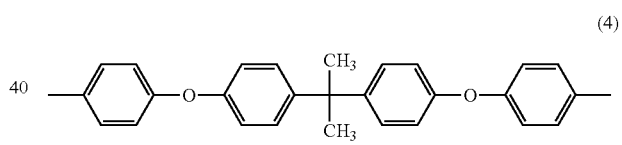

(4)

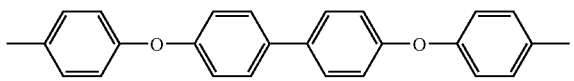

(5)

and is a divalent aliphatic group having from 2 to 39 carbon atoms, a divalent alicyclic group having from 3 to 39 carbon atoms, a divalent aromatic group having from 6 to 39 carbon atoms or a divalent group composed of a combination thereof. At least one kind of a bonding group selected from the group consisting of —O—, —SO$_2$—, —CH$_2$—, —C(CH$_3$)$_2$—, —OSi(CH$_3$)$_2$—, —C$_2$H$_4$O— and —S— may intervene in a main chain of X. Also, X may have at least one kind of a functional group selected from the group consisting of a carboxyl group, a hydroxyl group and a carbonyl group (contained in the main chain of X). Specific examples of X include divalent aliphatic groups such as a polyalkylene group, a polyoxyalkylene group, a xylylene group and alkyl substitution products, halogen substitution products, carboxy substitution products and hydroxy substitution products thereof, etc.; divalent alicyclic groups derived from cyclohexane, dicyclohexylmethane, dimethylcyclohexane, isophorone, norbornane and alkyl substitution products, halogen substitution products, carboxy substitution products and hydroxy substitution products thereof, etc.; and divalent aromatic groups derived from benzene, naphthalene, biphenyl, diphenylmethane, diphenyl ether, diphenyl sulfone, benzophenone and alkyl substitution products, halogen substitution products, carboxy substitution products and hydroxy substitution products thereof, etc. For the purpose of enhancing the adhesive strength while keeping a balance among various properties of the adhesive layer, an m-xylylene group is preferable.

In the polyimide A, in the case of containing the repeating unit represented by the formula (3), from the standpoint of low water absorption properties, a proportion of the subject repeating unit to the total sum of the repeating unit represented by the formula (1) and the repeating unit represented by the formula (2) [(the repeating unit represented by the formula (3))/(the total sum of the repeating unit represented by the formula (1) and the repeating unit represented by the formula (2))] is preferably not more than 100% by mole, more preferably not more than 43% by mole, and further preferably not more than 25% by mole in terms of % by mole.

The polyimide A is obtained by reacting at least one kind of a tetracarboxylic acid component (Y) selected from the group consisting of 1,2,4,5-cyclohexanetetracarboxylic acid, 1,2,4,5-cyclohexanetetracarboxylic dianhydride (HPMDA) and a reactive derivative of 1,2,4,5-cyclohexanetetracarboxylic acid (for example, an ester, etc.), at least one kind of a diamine component (Z) selected from a diamine and a reactive derivative thereof and at least one kind of an end-capping component (W) selected from the group consisting of a dicarboxylic anhydride consisting of 5-norbornene-2,3-dicarboxylic anhydride, citraconic anhydride and maleic anhydride. The tetracarboxylic acid component (Y) is preferably HPMDA from the standpoint of revealing solvent solubility in the polyimide A. Each of the tetracarboxylic acid component (Y), the diamine component (Z) and the end-capping component (W) may include an isomer thereof.

Though examples of the diamine component (Z) include a diamine, a diisocyanate, a diaminodisilane and the like, a diamine is preferable from the standpoint of easiness of synthesis. The diamine component (diamine component (Z1)) for forming the repeating unit of the formula (1) is 2,2-bis[4-(4-aminophenoxy)phenyl]propane (BAPP) or a reactive derivative thereof; the diamine component (diamine component (Z2)) for forming the repeating unit of the formula (2) is 4,4'-bis(4-aminophenoxy)biphenyl (BAPB) or a reactive derivative thereof; and the diamine component (diamine component (Z3)) for forming the repeating unit of the formula (3) is NH$_2$—X—NH$_2$ (X is the same as defined above, provided that (Z3) is different from (Z1) and (Z2)) or a reactive derivative thereof.

The diamine component (Z) is composed of the diamine component (Z1) and/or the diamine component (Z2), or composed of the diamine component (Z1) and/or the diamine component (Z2) and the diamine component (Z3); and when the subject diamine component (Z) is a mixture, the total sum of use amount of the subject diamine component (Z1) and diamine component (Z2) is 50% by mole or more of the total sum of all of the diamine components. From the standpoint of low water absorption properties, a use proportion of the diamine component (Z1) and/or the diamine component (Z2) and the diamine component (Z3) [(diamine component (Z3))/(diamine component (Z1) and/or diamine component (Z2))] is preferably not more than 100% by mole, more preferably not more than 43% by mole, and further preferably not more than 25% by mole.

The diamine component (Z3) is one other than (Z1) and (Z2) and may be any of an aromatic diamine, an aliphatic diamine, an alicyclic diamine, a reactive derivative of the foregoing diamine and a mixture thereof. The "aromatic diamine" as referred to in the present invention expresses a diamine in which an amino group is bonded directly on an aromatic ring and may contain an aliphatic group, an alicyclic group, an aromatic group or other substituent in a part of a structure thereof. The "aliphatic diamine" as referred to herein expresses a diamine in which an amino group is bonded directly on an aliphatic group and may contain an aliphatic group, an alicyclic group, an aromatic group or other substituent in a part of a structure thereof. The "alicyclic diamine" as referred to herein expresses a diamine in which an amino group is bonded directly on an alicyclic group and may contain an aliphatic group, an alicyclic group, an aromatic group or other substituent in a part of a structure thereof. For example, BAPP is an aromatic diamine because an amino group is bonded directly on an aromatic ring (benzene ring); and m-xylylenediamine (MXDA) is an aliphatic diamine because an amino group is bonded directly on an aliphatic group (methylene group).

In general, when a tetracarboxylic dianhydride is reacted with an aliphatic diamine or an alicyclic diamine, a polyamic acid as an intermediate and an amino group derived from the aliphatic diamine or alicyclic diamine form a firm salt, and therefore, a polyimide having a high molecular weight is hardly obtainable. For that reason, devising, for example, use of a solvent to which the salt has relatively high solubility, such as cresol, or the like is needed. However, when 1,2,4,5-cyclohexanetetracarboxylic dianhydride is used as the tetracarboxylic dianhydride, a polyamic acid and an amino group derived from the aliphatic diamine or alicyclic diamine do no more than form a salt with relatively weak bonding, and therefore, an imidation reaction relatively easily proceeds, and a high molecular weight can be easily achieved.

Examples of the aliphatic diamine include ethylenediamine, hexamethylenediamine, polyethylene glycol bis(3-aminopropyl)ether, polypropylene glycol bis(3-aminopropyl)ether, 1,3-bis(aminomethyl)cyclohexane, 1,4-bis(aminomethyl)cyclohexane, p-xylylenediamine, m-xylylenediamine, siloxanediamines, etc.

Examples of the alicyclic diamine include 4,4'-diaminodicyclohexylmethane, isophoronediamine, norbornanediamine, etc.

Examples of the aromatic diamine include 1,4-phenylenediamine, 1,3-phenylenediamine, 2,4-toluenediamine, 4,4'-diaminodiphenyl ether, 3,4'-diaminodiphenyl ether, 4,4'-diaminodiphenylmethane, 1,4-bis(4-aminophenoxy)benzene, 1,3-bis(4-aminophenoxy)benzene, 1,3-bis(3-aminophenoxy)benzene, α,α'-bis(4-aminophenyl)-1,4-diisopropylbenzene, α,α'-bis(3-aminophenyl)-1,4-diisopropylbenzene, 2,2-bis[4-(4-aminophenoxy)phenyl]propane, 4,4'-diaminodiphenylsulfone, bis[4-(4-aminophenoxy)phenyl]sulfone, bis[4-(3-aminophenoxy)phenyl]sulfone, 2,6-diaminonaphthalene, 1,5-diaminonaphthalene, etc.

Examples of the foregoing substituent-containing diamine include 3,3'-dicarboxy-4,4'-diaminodiphenylmethane, 3,5-diaminobenzoic acid, 3,3'-dihydroxy-4,4'-diaminobiphenyl, 2,4-diaminophenol, 4,4'-diaminobenzophenone and 3,3'-diaminobenzophenone; and 3,3'-dicarboxy-4,4'-diaminodiphenylmethane (MBAA), 3,5-diaminobenzoic acid (DBA), 3,31-dihydroxy-4,4'-diaminobiphenyl (HAB) and 4,4'-diaminobenzophenone (4,4'-DBP) are especially preferable.

Use of MXDA as the diamine component (Z3) is preferable because an adhesive force of the polyimide resin can be enhanced.

A molecular end of a polyimide composed of only a tetracarboxylic acid component and a diamine component is usually an amino group, a carboxyl group or a carboxylic anhydride group. By reacting a compound having a dicarboxylic anhydride group or an amino group on such a molecular end, it is possible to reduce a functional group on the molecular end as far as possible, or to intentionally introduce a functional group such as an amino group, a carboxyl group, etc. or a substituent other than this into the molecular end. In order to lower the coefficient of water absorption, it is effective to introduce a substituent with low polarity into the molecular end. From the standpoint of soldering heat resistance of the obtained metal-clad laminate, the coefficient of water absorption of the polyimide A which is measured by a method as described later is preferably not more than 2.5%, more preferably not more than 2.2%, and further preferably not more than 2.0%. A minimum value of the coefficient of water absorption which can be industrially achieved is usually about 1%.

For end-capping of the molecular end of the amino group, a dicarboxylic anhydride is used. Examples thereof include phthalic anhydride, 1,2-naphthalenedicarboxylic anhydride, 2,3-naphthalenedicarboxylic anhydride, 1,8-naphthalenedicarboxylic anhydride, 2,3-biphenyldicarboxylic anhydride, 3,4-biphenyldicarboxylic anhydride, a material obtained by substituting one or more hydrogens of the benzene ring of such a compound with a group which is inert to an amino group, a carboxyl group or a dicarboxylic anhydride group, 1,2,3,6-tetrahydrophthalic anhydride, 1,2-cyclohexanedicarboxylic anhydride, 5-norbornene-2,3-dicarboxylic anhydride (nasic anhydride, NAn), methyl-5-norbornene-2,3-dicarboxyluc anhydride, citraconic anhydride (CAn), maleic anhydride (MAn), 3-ethynylphthalic acid, 4-ethynylphthalic acid, 4-phenylethynylphthalic acid, etc, but it should not be construed that the present invention is limited thereto. These can be used singly or in combination of two or more kinds thereof. Of these, NAn, CAn or MAn is preferable as the end-capping component (W) from the standpoint of achieving a low coefficient of water absorption.

When NAn, CAn or MAn is chosen as the end-capping component (W), not only a lowering of the coefficient of water absorption of the polyimide A can be expected, but a reactive group capable of causing an addition reaction is introduced into the molecular end so that an addition reaction in which the reactive group takes part among the molecules of the polyimide A as the adhesive layer at the time of molding a metal-clad laminate can be caused, whereby adhesive properties of the metal-clad laminate and reliability on the heat resistance are enhanced. At that time, it is not needed at all that all of the molecules evenly react, and its effect is revealed by the addition reaction by a part of the molecules. Accordingly, it is not needed that the reactive group exists in all of the molecular ends. As to the reason why in the metal-clad laminate using the polyimide A in the adhesive layer, after the polyimide A advances the addition reaction, the adhesive properties and soldering heat resistance are enhanced, it is assumed to be one factor that a network structure is formed within the molecule due to the addition reaction in which the reactive group existing in the molecular end takes part to form a cured material, whereby the strength and heat resistance of the adhesive layer itself are enhanced.

The nasic, citraconic or maleic reactive group which is the molecular end of the polyimide A in the case of using NAn, CAn or MAn as the end-capping component starts an addition reaction at a temperature in the range of from 240 to 280° C. Accordingly, at the time of heat pressing in forming the metal-clad laminate or at the time of subsequently allowing it to stand, when a heat history of keeping the temperature in the range of from about 240 to 350° C. including the range of from 240 to 280° C. for one minute or more, preferably 5 minutes or more, more preferably 10 minutes or more, and especially preferably 30 minutes or more elapses, the addition reaction of the polyimide A thoroughly proceeds to form a cured material, whereby the adhesive properties and soldering heat resistance in the case of forming a metal-clad laminate are enhanced. When the temperature is lower than 240° C., there is a tendency that it takes a lot of time to achieve the addition reaction.

The polyimide A contains a material in which the molecular end is capped by the end-capping component (W). A degree of capping can be regulated by a ratio among the tetracarboxylic acid component (Y), the diamine component (Z) and the end-capping component (W) as the major raw materials. Specifically, the polyimide A is prepared in a ratio of preferably from 0.66 to 0.99 moles for the tetracarboxylic acid component (Y) and from 0.66 to 0.02 moles for the end-capping component (W), respectively, more preferably from 0.8 to 0.98 moles for the tetracarboxylic acid component (Y) and from 0.4 to 0.02 moles for the end-capping component (W), respectively, and further preferably from 0.9 to 0.97 moles for the tetracarboxylic acid component (Y) and from 0.2 to 0.02 moles for the end-capping component (W), respectively per mole of the diamine component (Z). In all of the cases, the polyimide A is manufactured by the reaction on the assumption that the sum of the tetracarboxylic acid component (Y) and a half of the end-capping component (W) does not exceed one mole per mole of the diamine component (Z). When the amount of the tetracarboxylic acid component (Y) is 0.66 moles or more per mole of the diamine component (Z), the molecular weight of the obtained polyimide is sufficient, physical properties of the obtained cured material are excellent, and when formed into a metal-clad laminate, sufficient peel strength can be obtained. On the other hand, when the amount of the tetracarboxylic acid component exceeds 0.99 moles and is closed to 1 per mole of the diamine component (Z), though the molecular weight of the obtained polyimide is high, a crosslinking density of the obtained cured material is low so that there is a possibility that the peel strength is not enhanced.

Since the polyimide A is used as a solution, it is preferable that its molecular weight is expressed in terms of viscosity, especially logarithmic viscosity. A logarithmic viscosity η of the polyimide A (as measured at 30° C. using a 0.5 g/dL solution in N-methyl-2-pyrrolidone) is preferably from 0.15 to 2 dL/g. When the logarithmic viscosity η is 0.15 dL/g or more, the molecular weight of the polyimide resin is sufficient, when cured, physical properties thereof are excellent, and when formed into a metal-clad laminate, sufficient peel strength can be obtained. When the logarithmic viscosity η is not more than 2.0 dL/g, a viscosity of its solution (varnish) is appropriate, coating is easy, and handling is easy. The logarithmic viscosity η is preferably in the range of from 0.3 to 1.5 dL/g.

The polyimide A is usually manufactured as an organic solvent solution.

Though the organic solvent is not particularly limited, for example, N-methyl-2-pyrrolidone, N,N-dimethylacetamide, N,N-diethylacetamide, N,N-dimethylformamide, N,N-diethylformamide, N-methylcaprolactam, hexamethylphosphoramide, tetramethylene sulfone, dimethyl sulfoxide, m-cresol, phenol, p-chlorophenol, 2-chloro-4-hydroxytoluene, diglyme, triglyme, tetraglyme, dioxane, γ-butyrolactone, dioxolan, cyclohexanone, cyclopentanone, dichloromethane, chloroform, 1,2-dichloroethane, 1,1,2-trichloroethane, dibromomethane, tribromomethane, 1,2-dibromoethane, 1,1,2-tribromoethane and the like are useful; and two or more kinds of these solvents may be used in combination. However, taking into consideration the performance of a polyimide varnish composed of the polyimide A and the solvent, it is preferable to use N-methyl-2-pyrrolidone (NMP), N,N-dimethylacetamide (DMAC) or γ-butyrolactone (GBL) singly or in combination. The organic solvent is used in an amount such that the concentration of the polyimide A in the organic solvent solution is preferably from 1 to 50% by weight, and more preferably from 5 to 40% by weight. Also, in the case of the manufacture by solution polymerization, a poor solvent, for example, hexane, heptane, benzene, toluene, xylene, chlorobenzene, o-dichlorobenzene, etc. can be used in combination with the foregoing solvent to an extent that a polymer is not deposited.

The polyimide A can be manufactured by (1) a solution polymerization method, (2) a method in which a polyamic acid solution is prepared, subjected to fabrication and imidated, (3) a method in which a salt such as a half ester salt of HPMDA or an imide oligomer is obtained and subjected to solid phase polymerization, (4) a method in which a tetracarboxylic dianhydride and a diisocyanate are reacted, or other methods which have hitherto been publicly known. These methods may be employed in combination. Also, the manufacture may be carried out in the presence of a catalyst which has hitherto been publicly known, for example, acids such as aromatic carboxylic acids, etc., anhydrides, amines such as aromatic amines, aliphatic amines, tertiary amines, etc., and the like.

Of these methods, the following solution polymerization method (a) or (b) is preferable from the standpoint of the matter that the organic solvent solution of the polyimide A is directly obtainable.

Method (a):
(a1-1) A mixture containing the diamine component (Z) and an organic solvent and optionally, a catalyst is stirred at from 10 to 600 rpm to form a uniform solution, which is then kept at a temperature of from 30 to 90° C., and the tetracarboxylic acid component (Y) and optionally, a catalyst are added. Alternatively, (a1-2) A mixture containing the tetracarboxylic acid component (Y) and an organic solvent and optionally, a catalyst is stirred at from 10 to 600 rpm to form a uniform solution, which is then kept at a temperature of from 30 to 90° C., and the diamine component (Z) and optionally, a catalyst are added.

(a2) After the method (a1-1) or (a1-2), the temperature is raised to 160 to 230° C., and preferably 180 to 205° C. over from 0.1 to 6 hours. This temperature is influenced by a boiling point of the organic solvent to be used. The temperature is kept substantially constant for from 0.5 to 24 hours, preferably from 1 to 12 hours, and more preferably from 1 to 6 hours while collecting the components to be removed outside the reaction system.

(a3) If desired, after cooling to 10 to 205° C., the end-capping component (W) and optionally, an organic solvent and/or a catalyst are added, and the temperature is raised to 150 to 205° C., and preferably 160 to 200° C. The temperature is kept substantially constant for from 0.5 to 24 hours, and preferably from 1 to 6 hours while collecting the components to be removed outside the reaction system. Thereafter, if desired, an organic solvent is further added, and the mixture is cooled to an appropriate temperature.

Method (b):
(b1-1) A mixture containing the diamine component (Z) and an organic solvent and optionally, a catalyst is stirred at from 10 to 600 rpm to form a uniform solution, which is then kept at a temperature of from 30 to 90° C., and the tetracarboxylic acid component (Y) and the end-capping component (W) and optionally, a catalyst are added. Alternatively, (b1-2) A mixture containing the tetracarboxylic acid component (Y), the end-capping component (W) and an organic solvent and optionally, a catalyst is stirred at from 10 to 600 rpm to form a uniform solution, which is then kept at a temperature of from 30 to 90° C., and the diamine component (Z) and optionally, a catalyst are added.

(b2) After the method (b1-1) or (b1-2), the temperature is raised to 160 to 230° C., preferably 160 to 205° C., and more preferably 180 to 205° C. over from 0.1 to 6 hours. This temperature is influenced by a boiling point of the organic solvent to be used. The temperature is kept substantially constant for from 0.5 to 24 hours, and preferably from 2 to 12 hours while collecting the components to be removed outside the reaction system. Thereafter, if desired, an organic solvent is further added, and the mixture is cooled to an appropriate temperature.

In the present invention, it is preferable that the polyimide A is obtained by carrying out the reaction among the tetracarboxylic acid component (Y), the diamine component (Z) and the end-capping component (W) upon heating in an organic solvent solution in the presence or absence of a catalyst.

As the catalyst to be used in the solution polymerization for manufacturing the polyimide A, a tertiary amine compound is preferable; specific examples thereof include trimethylamine, triethylamine (TEA), tripropylamine, tributylamine, triethanolamine, N,N-dimethylethanolamine, N,N-diethylethanolamine, triethylenediamine, N-methylpyrrolidine, N-ethylpyrrolidine, N-methylpiperidine, N-ethylpiperidine, imidazole, pyridine, quinoline, isoquinoline and the like; and the reaction can be carried out in the presence of at least one kind of a catalyst selected from these materials. From the standpoint of carrying out the reaction in a low amount of the catalyst as far as possible for a period of time as short as possible, the use amount of the catalyst is preferably from 0.1 to 100% by mole, and more preferably from 1 to 10% by mole relative to the tetracarboxylic acid component (Y).

A surfactant such as fluorine substituted or polysiloxane based surfactants, etc. may be added in the organic solvent solution of the polyimide A. According to this, it becomes easy to obtain an adhesive layer and a polyimide resin film, each of which has satisfactory surface smoothness.

The present invention also provides an adhesive containing the polyimide A.

The polyimide resin film can be manufactured by coating (casting) the organic solvent solution of the polyimide A on a smooth support preferably provided with release properties, such as glass sheets, metal sheets, etc. and heating at from 50 to 220° C. to evaporate and remove the organic solvent. It is preferable that the solvent is evaporated and removed preferably at a temperature of not higher than 120° C. to form a self-supporting film; the subject film is then peeled away from the support; ends of the subject film are fixed; and the film is dried preferably at a temperature of from 50 to 220° C. to manufacture a polyimide resin film. The pressure at the time of drying may be any of reduced pressure, atmospheric pressure or elevated pressure. From the standpoint of use in an adhesive layer of a metal-clad laminate, a thickness of the polyimide resin film is preferably from 1 to 100 μm, and more preferably from 2 to 50 μm.

The metal-clad laminate of the present invention includes an insulating base material, a metal layer and an adhesive layer containing the polyimide A to be disposed therebetween.

The metal-clad laminate can be manufactured by a method in which an organic solvent solution of the polyimide A is coated on one or both of an insulating base material and a metal layer, the organic solvent is evaporated and removed preferably at from 50 to 220° C. to form an adhesive layer, and the insulating base material and the metal layer are then superimposed via the adhesive layer, followed by thermo-compression bonding; a method in which the foregoing polyimide resin film is disposed between an insulating base material and a metal layer, followed by thermo-compression bonding; or other method. Also, the metal-clad laminate in which an insulating base material and a metal layer are firmly bonded to each other can also be manufactured by a method in which a metal thin membrane is formed directly on one surface of a polyimide resin film by a method such as sputtering, vapor deposition, electroless plating, etc., and an insulating base material is placed on the other surface, followed by thermo-compression bonding; or a method in which an adhesive layer is formed on the surface of an insulating base material, and a metal thin membrane is formed on the surface of the subject adhesive layer by a method such as sputtering, vapor deposition, electroless plating, etc. From the standpoints of easiness of coating and adhesive force, a thickness of the adhesive layer is preferably from 1 to 100 μm, and more preferably from 2 to 50 μm.

The metal layer may also be formed of a metal foil obtainable by a method such as electrolysis, rolling, etc. As described previously, the metal layer may also be formed directly on the surface of the polyimide resin film or the surface of the adhesive layer formed on the insulating base material. Though a thickness of the metal layer is not particularly limited, it is preferably in the range of from 1 to 100 μm from the standpoints of handling properties and strength. A material of the metal layer is preferably copper. Also, one surface (adhesive surface) or both surfaces of the metal foil may be subjected to a surface treatment such that a surface roughness Rz is from 0.1 to 12 μm. In the case of a metal layer which is generally called a low profile, such as a copper foil, etc., Rz is not more than 2 μm.

From the standpoints of fine pitch and adhesive force, Rz is preferably from 0.1 to 4 μm, more preferably from 0.1 to 2 μm, further preferably from 0.4 to 2 μm, and still further preferably from 1.0 to 2 μm. In the metal foil which has not been subjected to a surface treatment for bonding, in many occasions, its surface is generally treated with a preservative, etc., and therefore, it is preferable to use the metal foil after wiping the surface by a cloth having acetone or other organic solvent permeated thereinto or other method.

The insulating base material of the present invention is not particularly limited so far as it is able to electrically insulate the metal layer. Also, any of a flexible type or a rigid type can be used as the insulating base material. Though a thickness of the insulating base material varies with the foregoing type, it is preferably from 3 to 2,000 μm. Examples of the insulating base material of a flexible type include films made of a polyimide resin (exclusive of the polyimide A), a polybenzimidazole, a polybenzoxazole, a polyamide (including aramid), a polyetherimide, a polyamide-imide, a polyester (including a liquid crystalline polyester), a polysulfone, a polyethersulfone, a polyetherketone, a polyetheretherketone, etc.; and of these, a polyimide resin film is preferable. Specific examples thereof include trade names, "KAPTON EN", "KAPTON V" and "KAPTON H" (manufactured by Du Pont-Toray Co., Ltd.); trade names, "APICAL NPI" and "APICAL AH" (manufactured by Kaneka Corporation); a trade name, "UPILEX-S" (manufactured by Ube Industries, Ltd.); and the like. Though its thickness is not particularly limited, it is preferably from 3 to 150 μm, and more preferably from 7.5 to 75 μm.

Examples of the insulating base material of a rigid type include those obtained by forming an insulating coating on an insulating material sheet or a metal sheet such as a glass sheet, a ceramic sheet, a plastic sheet, etc.; and moldings obtained by impregnating and kneading a reinforcing material such as a glass fiber cloth, a plastic fiber cloth, a glass short fiber, etc. with a thermoplastic or thermosetting resin of every sort, such as a liquid crystal polymer, a phenol resin, an epoxy resin, etc. Though its thickness is not particularly limited, it is preferably from 30 to 2,000 μm.

As the method of thermo-compression bonding, in general, a method by a multi-daylight (vacuum) press, a continuous pressing method using a pressure roll, etc. and the like can be properly adopted.

A temperature of the thermo-compression bonding is preferably from 200 to 400° C., and more preferably from 250 to 350° C. A pressure of the thermo-compression bonding is preferably from 0.01 to 20 MPa, and more preferably from 0.1 to 10 MPa. Also, for the purpose of removing the solvent and air bubbles, it is preferable to achieve the thermo-compression bonding under a reduced pressure atmosphere. The addition reaction of the polyimide A proceeds simultaneously at the time of the thermo-compression bonding. A thermo-compression bonding time is not particularly limited. However, when the thermo-compression bonding time is 0.5 hours or more, even by shortening a standing time for the purpose of enhancing the adhesive properties as a metal-clad laminate as described below, satisfactory adhesive properties can be exhibited without carrying out it as the case may be. After the thermo-compression bonding, when the metal-clad laminate is allowed to stand under a reduced pressure or nitrogen atmosphere at preferably from 100 to 400° C., and more preferably from 150 to 350° C. for preferably from 0.5 to 72 hours, and more preferably from 0.5 to 12 hours, the adhesive properties as the metal-clad laminate increase, and the polyimide A forms a heat cured material, whereby the heat resistance is enhanced. Therefore, such is preferable as the metal-clad laminate.

When the metal layer of the metal-clad laminate of the present invention has a peel strength, as measured according to the peel strength measurement method of a copper foil by peeling at 90° in conformity with JIS C6471 as described later, of 0.5 N/mm or more, it can be put into practical use. The peel strength is preferably 0.8 N/mm or more, and more preferably 1.0 N/mm or more.

EXAMPLES

The present invention is specifically described below with reference to the following Examples. However, it should be construed that the present invention is not limited thereto at all.

Measurement methods of physical properties are hereunder shown.

(1) IR Spectrum:

An IR spectrum was measured using JIR-WINSPEC50, manufactured by JEOL Ltd.

(2) Logarithmic Viscosity $\eta$:

A solution of 0.5 g/dL of a polyimide in N-methyl-2-pyrrolidone was prepared. A liquid level drop time of this solution between marked lines was measured in a constant-temperature water bath at 30° C. by a Cannon-Fenske viscometer, and a logarithmic viscosity $\eta$ was determined according to the following expression.

$$\eta(dL/g)=\ln[(\text{drop time of solution})/(\text{drop time of N-methyl-2-pyrrolidone})]/0.5$$

As to the logarithmic viscosity, its value closely resembles to an intrinsic viscosity and can be determined simply and easily.

(3) Coefficient of Water Absorption of Polyimide:

A coefficient of water absorption of a polyimide was determined according to the method of IPC-TM-650 2.6.2.1.

After drying a polyimide film of 50.8 mm×50.8 mm at 120° C. for one hour, its weight ($W_0$) was measured. This film was dipped in distilled water at 23° C. for 24 hours, and after wiping off water on the surface, its weight ($W_1$) was rapidly measured.

$$\text{Coefficient of water absorption (\%)}=[(W_1-W_0)\div W_0]\times 100$$

(4) Peel Strength of Metal Layer:

A peel strength of a metal layer was determined according to the peel strength measurement method of a copper foil by peeling at 90° in conformity with JIS C6471 (method A using a rotating drum type support fitting for peel strength measurement).

(5) Soldering Heat Resistance:

The following test was carried out while referring to JIS C6471.

A specimen of 10 mm×50 mm was cut out from a metal-clad laminate and allowed to stand in a constant-temperature chamber at a humidity of 50% and 23° C. for 24 hours. Subsequently, the specimen was floated on a soldering bath for 20 seconds. Separate specimens were used at a temperature of 260° C. and 280° C. The case where appearance abnormality such as blister, peeling, etc. was not caused was designated as "A"; and the case where appearance abnormality was caused was designated as "C".

Example 1

In a 300-mL five-necked glass-made round bottom flask which was provided with a Dean-Stark equipped with a stainless steel-made semicircular stirring blade, a nitrogen introducing tube and a cooling tube, a thermometer and a glass-made end cap, 27.19 g (0.06624 moles) of 2,2-bis[4-(4-aminophenoxy)phenyl]propane (BAPP, manufactured by Wakayama Seika Kogyo Co., Ltd.), 50.00 g of N-methyl-2-pyrrolidone (NMP, manufactured by Mitsubishi Chemical Corporation) and 0.32 g of triethylamine (TEA, manufactured by Kanto Chemical Co., Inc.) as a catalyst were stirred under a nitrogen atmosphere at 100 rpm, thereby obtaining a solution.

14.11 g (0.06293 moles) of 1,2,4,5-cyclohexanetetracarboxylic dianhydride (HPMDA, manufactured by Mitsubishi Gas Chemical Company, Inc.) and 7.00 g of NMP were collectively added thereto, respectively, and the mixture was then heated by a mantle heater, thereby raising the temperature within the reaction system to 200° C. over about 20 minutes. The temperature within the reaction system was kept at 200° C. for 5 hours while collecting a component to be distilled off.

The reaction mixture was cooled to 160° C. over about 5 minutes, 1.09 g (0.00662 moles) of nasic anhydride (NAn, manufactured by Wako Pure Chemical Industries, Ltd.) and 6.58 g of NMP were collectively added, respectively, and the mixture was then heated by a mantle heater, thereby raising the temperature within the reaction system to 195° C. over about 20 minutes. The temperature within the reaction system was kept at 195° C. for 5 hours while collecting a component to be distilled off.

After adding 96.42 g of N,N-dimethylacetamide (DMAC, manufactured by Mitsubishi Gas Chemical Company, Inc.), the mixture was stirred at around 130° C. for about 30 minutes, thereby forming a uniform solution, which was then cooled to 100° C. over about 10 minutes. There was thus obtained a polyimide A solution having a solids content of 20% by weight.

The obtained polyimide A solution was coated on a smooth glass sheet on which an extremely small amount of a release agent had been sprayed by a coater and then heated on a hot plate at 100° C. for 1 hour, thereby forming a self-supporting film. The film which had been peeled away from the glass sheet was fixed in several placed by clips onto a stainless steel-made frame and then allowed to stand in a vacuum dryer at 200° C. for 5 hours, thereby removing the solvent substantially completely (less than 1% by weight). There was thus obtained a film of the polyimide A. As a result of measuring an IR spectrum of this film of the polyimide A, characteristic absorption of an imide ring was observed at $\nu$ (C=O) of 1,778 and 1,704 (cm$^{-1}$). This polyimide A had a logarithmic viscosity of 0.54 dL/g and a coefficient of water absorption of 1.4%.

A 25 μm-thick polyimide resin film (a trade name: KAPTON 100EN, manufactured by Du Pont-Toray Co., Ltd.) was used as an insulating base material; and the above-obtained polyimide A solution was coated on one surface thereof, heated on a hot plate at 100° C. for 0.5 hours and dried in a vacuum dryer at 200° C. for 5 hours, thereby forming an adhesive layer having a thickness of 4 μm on the insulating base material. An 18 μm-thick electrolytic copper foil having been subjected to a surface roughing treatment for bonding and having Rz of 3.8 μm (a product name: 3EC-VLP, manufactured by Mitsui Mining & Smelting Co., Ltd.) was used as a metal layer, and the electrolytic copper foil was superimposed on the adhesive layer formed on the insulating base material via the roughed surface. This was sandwiched by stainless steel mirror finished sheets, put into hot plates of a heat press at a temperature of 330° C. and kept at a contact pressure (0 MPa) for 3 minutes, followed by thermo-compression bonding under a condition at 330° C. and 5 MPa for 30 minutes. Subsequently, the resultant was put between hot plates of a pressing machine at ordinary temperature and cooled under a condition at 5 MPa for 2 minutes, thereby obtaining a metal-clad laminate.

The peel strength of the metal layer of the obtained metal-clad laminate was 1.26 N/mm, and the solder heat resistance was rated as "A".

Example 2

In the same five-necked glass-made round bottom flask as that used in Example 1, 27.43 g (0.06682 moles) of BAPP, 50.00 g of NMP and 0.30 g of TEA as a catalyst were stirred under a nitrogen atmosphere at 100 rpm, thereby obtaining a solution.

13.48 g (0.06014 moles) of HPMDA and 7.00 g of NMP were collectively added thereto, respectively, and the mixture was then heated by a mantle heater, thereby raising the temperature within the reaction system to 200° C. over about 20 minutes. The temperature within the reaction system was kept at 200° C. for 5 hours while collecting a component to be distilled off.

The reaction mixture was cooled to 160° C. over about 5 minutes, 1.50 g (0.01336 moles) of citraconic anhydride (CAn, manufactured by Tokyo Chemical Industry Co., Ltd.) and 6.61 g of NMP were collectively added, respectively, and the mixture was then heated by a mantle heater, thereby raising the temperature within the reaction system to 175° C. over about 10 minutes. The temperature within the reaction system was kept at 175° C. for 2.5 hours while collecting a component to be distilled off.

After adding 96.39 g of DMAC, the mixture was stirred at a temperature in the vicinity of 130° C. for about 30 minutes, thereby forming a uniform solution, which was then cooled to 100° C. over about 10 minutes. There was thus obtained a polyimide A solution having a solids content of 20% by weight.

A polyimide A film was obtained in the same manner as in Example 1, except for using the obtained polyimide A solution. As a result of measuring an IR spectrum of this polyimide A film, characteristic absorption of an imide ring was observed at ν (C=O) of 1,776 and 1,704 (cm$^{-1}$). This polyimide A had a logarithmic viscosity η of 0.52 dL/g and a coefficient of water absorption of 1.5%.

A metal-clad laminate was obtained in the same manner as in Example 1, except for using the obtained polyimide A solution. The peel strength of the metal layer of the obtained metal-clad laminate was 1.34 N/mm, and the solder heat resistance was rated as "A".

Example 3

In the same five-necked glass-made round bottom flask as that used in Example 1, 27.47 g (0.06691 moles) of BAPP, 50.00 g of NMP and 0.33 g of TEA as a catalyst were stirred under a nitrogen atmosphere at 100 rpm, thereby obtaining a solution.

14.55 g (0.06490 moles) of HPMDA and 7.00 g of NMP were collectively added thereto, respectively, and the mixture was then heated by a mantle heater, thereby raising the temperature within the reaction system to 200° C. over about 20 minutes. The temperature within the reaction system was kept at 200° C. for 5 hours while collecting a component to be distilled off.

The reaction mixture was cooled to 160° C. over about 5 minutes, 0.39 g (0.00401 moles) of maleic anhydride (MAn, manufactured by Kanto Chemical Co., Inc.) and 6.62 g of NMP were collectively added, respectively, and the mixture was then heated by a mantle heater, thereby raising the temperature within the reaction system to 175° C. over about 10 minutes. The temperature within the reaction system was kept at 175° C. for 1.5 hours while collecting a component to be distilled off.

After adding 96.38 g of DMAC, the mixture was stirred at a temperature in the vicinity of 130° C. for about 30 minutes, thereby forming a uniform solution, which was then cooled to 100° C. over about 10 minutes. There was thus obtained a polyimide A solution having a solids content of 20% by weight.

A polyimide A film was obtained in the same manner as in Example 1, except for using the obtained polyimide A solution. As a result of measuring an IR spectrum of this polyimide A film, characteristic absorption of an imide ring was observed at ν (C=O) of 1,776 and 1,704 (cm$^{-1}$). This polyimide A had a logarithmic viscosity η of 0.84 dL/g and a coefficient of water absorption of 1.4%.

A metal-clad laminate was obtained in the same manner as in Example 1, except for using the obtained polyimide A solution. The peel strength of the metal layer of the obtained metal-clad laminate was 1.35 N/mm, and the solder heat resistance was rated as "A".

Example 4

In the same five-necked glass-made round bottom flask as that used in Example 1, 26.23 g (0.07120 moles) of 4,4'-bis (4-aminophenoxy)biphenyl (BAPB, manufactured by Wakayama Seika Kogyo Co., Ltd.), 51.08 g of γ-butyrolactone (GBL, manufactured by Mitsubishi Gas Chemical Company, Inc.) and 0.34 g of TEA as a catalyst were stirred under a nitrogen atmosphere at 100 rpm, thereby obtaining a solution.

15.16 g (0.06764 moles) of HPMDA, 1.17 g (0.00712 moles) of NAn and 6.00 g of DMAC were collectively added thereto, respectively, and the mixture was then heated by a mantle heater, thereby raising the temperature within the reaction system to 190° C. over about 20 minutes. The temperature within the reaction system was kept at 190° C. for 7 hours while collecting a component to be distilled off.

After adding 96.15 g of DMAC, the mixture was stirred at around 130° C. for about 30 minutes, thereby forming a uniform solution, which was then cooled to 100° C. over about 10 minutes. There was thus obtained a polyimide A solution having a solids content of 20% by weight.

A polyimide A film was obtained in the same manner as in Example 1, except for using the obtained polyimide A solution. As a result of measuring an IR spectrum of this polyimide A film, characteristic absorption of an imide ring was observed at ν (C=O) of 1,778 and 1,704 (cm$^{-1}$). This polyimide A had a logarithmic viscosity η of 0.67 dL/g and a coefficient of water absorption of 1.9%.

A 25 μm-thick polyimide resin film (a trade name: KAPTON 100EN, manufactured by Du Pont-Toray Co., Ltd.) was used as an insulating base material; and the above-obtained polyimide A solution was coated on one surface thereof, heated on a hot plate at 100° C. for 0.5 hours and then dried in a vacuum dryer at 200° C. for 5 hours, thereby forming an adhesive layer having a thickness of 4 μm on the insulating base material. An 18 μm-thick electrolytic copper foil having been subjected to a surface roughing treatment for bonding and having Rz of 3.8 μm (a product name: 3EC-VLP, manufactured by Mitsui Mining & Smelting Co., Ltd.) was used as a metal layer, and the electrolytic copper foil was superimposed on the adhesive layer formed on the insulating base material via the roughed surface. This was sandwiched by stainless steel mirror finished sheets, put into hot plates of a heat press at a temperature of 330° C. and kept at a contact pressure (0 MPa) for 3 minutes, followed by thermo-compression bonding under a condition at 330° C. and 5 MPa for 60 minutes. Subsequently, the resultant was put between hot plates of a pressing machine at ordinary temperature and cooled under a condition at 5 MPa for 2 minutes, thereby obtaining a metal-clad laminate.

The peel strength of the metal layer of the obtained metal-clad laminate was 1.29 N/mm, and the solder heat resistance was rated as "A".

Example 5

In the same five-necked glass-made round bottom flask as that used in Example 1, 25.87 g (0.06302 moles) of BAPP, 0.96 g (0.00700 moles) of m-xylylenediamine (MXDA, manufactured by Mitsubishi Chemical Corporation) and 50.00 g of NMP were stirred under a nitrogen atmosphere at 100 rpm, thereby obtaining a solution.

14.91 g (0.06653 moles) of HPMDA and 7.00 g of NMP were collectively added thereto, respectively, and the mixture was then heated by a mantle heater, thereby raising the temperature within the reaction system to 200° C. over about 20 minutes. The temperature within the reaction system was kept at 200° C. for 5 hours while collecting a component to be distilled off.

The reaction mixture was cooled to 160° C. over about 5 minutes, 0.78 g (0.00700 moles) of CAn and 6.79 g of NMP were collectively added, respectively, and the mixture was then heated by a mantle heater, thereby raising the temperature within the reaction system to 175° C. over about 10 minutes. The temperature within the reaction system was kept at 175° C. for 2.5 hours while collecting a component to be distilled off.

After adding 96.21 g of DMAC, the mixture was stirred at a temperature in the vicinity of 130° C. for about 30 minutes, thereby forming a uniform solution, which was then cooled to 100° C. over about 10 minutes. There was thus obtained a polyimide A solution having a solids content of 20% by weight.

A polyimide A film was obtained in the same manner as in Example 1, except for using the obtained polyimide A solution. As a result of measuring an IR spectrum of this polyimide A film, characteristic absorption of an imide ring was observed at $\nu$ (C=O) of 1,772 and 1,704 (cm$^{-1}$). This polyimide A had a logarithmic viscosity of 0.58 dL/g and a coefficient of water absorption of 2.0%.

A metal-clad laminate was obtained in the same manner as in Example 1, except for using the obtained polyimide A solution. The peel strength of the metal layer of the obtained metal-clad laminate was 1.38 N/mm, and the solder heat resistance was rated as "A".

Example 6

In the same five-necked glass-made round bottom flask as that used in Example 1, 9.06 g (0.02208 moles) of BAPP, 8.14 g (0.02208 moles) of BAPB, 6.01 g (0.04416 moles) of MXDA and 50.00 g of NMP were stirred under a nitrogen atmosphere at 100 rpm, thereby obtaining a solution.

18.81 g (0.08391 moles) of HPMDA and 7.00 g of NMP were collectively added thereto, respectively, and the mixture was then heated by a mantle heater, thereby raising the temperature within the reaction system to 200° C. over about 20 minutes. The temperature within the reaction system was kept at 200° C. for 7 hours while collecting a component to be distilled off.

The reaction mixture was cooled to 160° C. over about 5 minutes, 1.16 g (0.00707 moles) of NAn and 7.77 g of NMP were collectively added, respectively, and the mixture was then heated by a mantle heater, thereby raising the temperature within the reaction system to 195° C. over about 20 minutes. The temperature within the reaction system was kept at 195° C. for 5 hours while collecting a component to be distilled off.

After adding 95.26 g of DMAC, the mixture was stirred at a temperature in the vicinity of 130° C. for about 30 minutes, thereby forming a uniform solution, which was then cooled to 100° C. over about 10 minutes. There was thus obtained a polyimide A solution having a solids content of 20% by weight.

A polyimide A film was obtained in the same manner as in Example 1, except for using the obtained polyimide A solution. As a result of measuring an IR spectrum of this polyimide A film, characteristic absorption of an imide ring was observed at $\nu$ (C=O) of 1,775 and 1,704 (cm$^{-1}$). This polyimide A had a logarithmic viscosity $\eta$ of 0.50 dL/g and a coefficient of water absorption of 2.2%.

A 25 μm-thick polyimide resin film (a trade name: KAPTON 100EN, manufactured by Du Pont-Toray Co., Ltd.) was used as an insulating base material; and the above-obtained polyimide A solution was coated on one surface thereof, heated on a hot plate at 100° C. for 0.5 hours and then dried in a vacuum dryer at 200° C. for 5 hours, thereby forming an adhesive layer having a thickness of 4 μm on the insulating base material. A 9 μm-thick electrolytic copper foil having been subjected to a surface roughing treatment for bonding and having Rz of 1.5 μm (a product name: F2-WS, manufactured by Furukawa Circuit Foil Co., Ltd.) was used as a metal layer, and the electrolytic copper foil was superimposed on the adhesive layer formed on the insulating base material via the roughed surface. This was sandwiched by stainless steel mirror finished sheets, put into hot plates of a heat press at a temperature of 330° C. and kept at a contact pressure (0 MPa) for 3 minutes, followed by thermo-compression bonding under a condition at 330° C. and 5 MPa for 30 minutes. Subsequently, the resultant was put between hot plates of a pressing machine at ordinary temperature and cooled under a condition at 5 MPa for 2 minutes, thereby obtaining a metal-clad laminate.

The peel strength of the metal layer of the obtained metal-clad laminate was 1.45 N/mm, and the solder heat resistance was rated as "A".

Comparative Example 1

In the same five-necked glass-made round bottom flask as that used in Example 1, 20.62 g (0.10299 moles) of 4,4'-diaminodiphenyl ether (ODA, manufactured by Wakayama Seika Kogyo Co., Ltd.), 52.45 g of GBL and 0.52 g of TEA were stirred under a nitrogen atmosphere at 100 rpm, thereby obtaining a solution.

23.09 g (0.10299 moles) of HPMDA and 13.11 g of DMAC were collectively added thereto, respectively, and the mixture was then heated by a mantle heater, thereby raising the temperature within the reaction system to 180° C. over about 20 minutes. The temperature within the reaction system was kept at 180° C. for 3 hours while collecting a component to be distilled off.

After adding 94.43 g of DMAC, the mixture was stirred at a temperature in the vicinity of 130° C. for about 30 minutes, thereby forming a uniform solution, which was then cooled to 100° C. over about 10 minutes. There was thus obtained a polyimide resin solution having a solids content of 20% by weight.

A polyimide resin film was obtained in the same manner as in Example 1, except for using the obtained polyimide resin solution. As a result of measuring an IR spectrum of this polyimide resin film, characteristic absorption of an imide ring was observed at ν (C=O) of 1,772 and 1,700 (cm$^{-1}$). This polyimide had a logarithmic viscosity η of 0.90 dL/g and a coefficient of water absorption of 5.7%.

A metal-clad laminate was obtained in the same manner as in Example 1, except for using the obtained polyimide resin solution. The metal layer of the obtained metal-clad laminate could be easily peeled away by fingers so that its peel strength was extremely low.

Comparative Example 2

In the same five-necked glass-made round bottom flask as that used in Example 1, 22.50 g (0.1004 moles) of HPMDA, 31.42 g of NMP, 20.36 g of DMAC and 0.51 g of TEA as a catalyst were stirred under a nitrogen atmosphere at 100 rpm, thereby obtaining a solution.

In a 200-mL beaker, 21.12 g (0.1004 moles) of 4,4'-diaminodicyclohexylmethane (DCHM, manufactured by New Japan Chemical Co., Ltd.) which has been heated at about 80° C. was dissolved in 40.00 g of NMP, and the solution was transferred into a 200-mL dropping funnel together with 10.00 g of NMP. The glass-made end cap of the five-necked glass-made round bottom flask was taken away, the subject 200-mL dropping funnel was installed, and the mixture was dropped over about 2 hours. After completion of dropping, the internal temperature was regulated to 90° C. over 10 minutes, thereby keeping at 90° C. for 5 hours. Thereafter, the mixture was then heated by a mantle heater, thereby raising the temperature within the reaction system to 180° C. over about 20 minutes. The temperature within the reaction system was kept at 180° C. for 2 hours while collecting a component to be distilled off.

After adding 58.23 g of DMAC, the mixture was stirred at around 130° C. for about 30 minutes, thereby forming a uniform solution, which was then cooled to 100° C. over about 10 minutes. There was thus obtained a polyimide resin solution having a solids content of 20% by weight.

A polyimide resin film was obtained in the same manner as in Example 1, except for using the obtained polyimide resin solution. As a result of measuring an IR spectrum of this polyimide resin film, characteristic absorption of an imide ring was observed at ν (C=O) of 1,768 and 1,689 (cm$^{-1}$). This polyimide had a logarithmic viscosity of 0.49 dL/g and a coefficient of water absorption of 6.5%.

A metal-clad laminate was obtained in the same manner as in Example 1, except for using the obtained polyimide resin solution. The peel strength of the metal layer of the obtained metal-clad laminate was 0.65 N/mm, and the solder heat resistance was rated as "C".

Comparative Example 3

In the same five-necked glass-made round bottom flask as that used in Example 1, 27.43 g (0.06682 moles) of BAPP, 50.89 g of GBL and 0.34 g of TEA were stirred under a nitrogen atmosphere at 100 rpm, thereby obtaining a solution.

14.979 g (0.06682 moles) of HPMDA and 12.72 g of DMAC were collectively added thereto, respectively, and the mixture was then heated by a mantle heater, thereby raising the temperature within the reaction system to 180° C. over about 20 minutes. The temperature within the reaction system was kept at 180° C. for 6 hours while collecting a component to be distilled off.

After adding 96.39 g of DMAC, the mixture was stirred at around 130° C. for about 30 minutes, thereby forming a uniform solution, which was then cooled to 100° C. over about 10 minutes. There was thus obtained a polyimide resin solution having a solids content of 20% by weight.

A polyimide resin film was obtained in the same manner as in Example 1, except for using the obtained polyimide resin solution. As a result of measuring an IR spectrum of this polyimide resin film, characteristic absorption of an imide ring was observed at ν (C=O) of 1,774 and 1,706 (cm$^{-1}$). This polyimide resin had a logarithmic viscosity of 1.00 dL/g and a coefficient of water absorption of 1.6%.

A metal-clad laminate was obtained in the same manner as in Example 1, except for using the obtained polyimide resin solution. The peel strength of the metal layer of the obtained metal-clad laminate was 0.62 N/mm, and the solder heat resistance was rated as "A".

Comparative Example 4

In the same five-necked glass-made round bottom flask as that used in Example 1, 26.48 g (0.07187 moles) of BAPB, 51.11 g of GBL and 0.36 g of TEA as a catalyst were stirred under a nitrogen atmosphere at 100 rpm, thereby obtaining a solution.

16.11 g (0.07187 moles) of HPMDA and 12.78 g of DMAC were collectively added thereto, respectively, and the mixture was then heated by a mantle heater, thereby raising the temperature within the reaction system to 180° C. over about 20 minutes. The temperature within the reaction system was kept at 180° C. for 3.5 hours while collecting a component to be distilled off.

After adding 96.11 g of DMAC, the mixture was stirred at around 130° C. for about 30 minutes, thereby forming a uniform solution, which was then cooled to 100° C. over about 10 minutes. There was thus obtained a polyimide resin solution having a solids content of 20% by weight.

A polyimide resin film was obtained in the same manner as in Example 1, except for using the obtained polyimide resin solution. As a result of measuring an IR spectrum of this polyimide resin film, characteristic absorption of an imide ring was observed at ν (C=O) of 1,779 and 1,704 (cm$^{-1}$). This polyimide resin had a logarithmic viscosity of 1.28 dL/g and a coefficient of water absorption of 2.2%.

A metal-clad laminate was obtained in the same manner as in Example 1, except for using the obtained polyimide resin solution. The peel strength of the metal layer of the obtained metal-clad laminate was 0.80 N/mm, and the solder heat resistance was rated as "A".

Comparative Example 5

In the same five-necked glass-made round bottom flask as that used in Example 1, 21.10 g (0.09413 moles) of HPMDA, 25.00 g of NMP, 20.33 g of DMAC and 0.48 g of TEA as a catalyst were stirred under a nitrogen atmosphere at 100 rpm, thereby obtaining a solution.

In a 200-mL beaker, 20.84 g (0.09908 moles) of 4,4'-diaminodicyclohexylmethane (DCHM, manufactured by New Japan Chemical Co., Ltd.) which had been heated at about 80° C. was dissolved in 40.00 g of NMP, and the solution was transferred into a 200-mL dropping funnel together with 10.00 g of NMP. The glass-made end cap of the five-necked glass-made round bottom flask was taken away, the subject 200-mL dropping funnel was installed, and the mixture was dropped over about 2 hours. After completion of dropping, the internal temperature was regulated to 90° C. over 10 minutes, thereby keeping at 90° C. for 5 hours. Thereafter, the mixture was then heated by a mantle heater, thereby raising the temperature within the reaction system to 180° C. over about 20 minutes. The temperature within the reaction system was kept at 180° C. for 2 hours while collecting a component to be distilled off.

The reaction mixture was cooled to 160° C. over about 5 minutes, 1.63 g (0.00991 moles) of NAn and 6.33 g of NMP were collectively added, respectively, and the mixture was then heated by a mantle heater, thereby raising the temperature within the reaction system to 195° C. over about 20 minutes. The temperature within the reaction system was kept at 195° C. for 2 hours while collecting a component to be distilled off.

After adding 58.33 g of DMAC, the mixture was stirred at around 130° C. for about 30 minutes, thereby forming a uniform solution, which was then cooled to 100° C. over about 10 minutes. There was thus obtained a polyimide resin solution having a solids content of 20% by weight.

A polyimide resin film was obtained in the same manner as in Example 1, except for using the obtained polyimide resin solution. As a result of measuring an IR spectrum of this polyimide resin film, characteristic absorption of an imide ring was observed at ν (C=O) of 1,768 and 1,689 (cm$^{-1}$). This polyimide had a logarithmic viscosity of 0.40 dL/g and a coefficient of water absorption of 6.0%.

A metal-clad laminate was obtained in the same manner as in Example 1, except for using the obtained polyimide resin solution. The peel strength of the metal layer of the obtained metal-clad laminate was 0.73 N/mm, and the solder heat resistance was rated as "C".

Comparative Example 6

In the same five-necked glass-made round bottom flask as that used in Example 1, 27.27 g (0.06642 moles) of BAPP, 50.87 g of NMP and 0.32 g of TEA as a catalyst were stirred under a nitrogen atmosphere at 100 rpm, thereby obtaining a solution.

14.15 g (0.06310 moles) of HPMDA, 0.98 g (0.00664 moles) of phthalic anhydride (PAn, measured by Kanto Chemical Co., Inc.) and 12.72 g of DMAC were collectively added thereto, respectively, and the mixture was then heated by a mantle heater, thereby raising the temperature within the reaction system to 190° C. over about 20 minutes. The temperature within the reaction system was kept at 190° C. for 7 hours while collecting a component to be distilled off.

After adding 96.41 g of DMAC, the mixture was stirred at around 130° C. for about 30 minutes, thereby forming a uniform solution, which was then cooled to 100° C. over about 10 minutes. There was thus obtained a polyimide resin solution having a solids content of 20% by weight.

A polyimide resin film was obtained in the same manner as in Example 1, except for using the obtained polyimide resin solution. As a result of measuring an IR spectrum of this polyimide resin film, characteristic absorption of an imide ring was observed at ν (C=O) of 1,773 and 1,705 (cm$^{-1}$). This polyimide had a logarithmic viscosity η of 0.45 dL/g and a coefficient of water absorption of 1.4%.

A metal-clad laminate was obtained in the same manner as in Example 1, except for using the obtained polyimide resin solution. The peel strength of the metal layer of the obtained metal-clad laminate was 0.20 N/mm, and the solder heat resistance was rated as "C".

TABLE 1

| | Tetracarboxylic acid component (Y) HPMDA | Diamine component (Z) | | | | End-capping component (W) | | Coefficient of water absorption | Peel strength | Soldering heat resistance |
|---|---|---|---|---|---|---|---|---|---|---|
| | | (Z1) BAPP | (Z2) BAPB | (Z3) | | | | | | |
| | (% by mole) | (% by mole) | (% by mole) | Kind | (% by mole) | Kind | (% by mole) | (%) | (N/mm) | |
| Example | | | | | | | | | | |
| 1 | 95 | 100 | — | — | — | NAn | 10 | 1.4 | 1.26 | A |
| 2 | 90 | 100 | — | — | — | CAn | 20 | 1.5 | 1.34 | A |
| 3 | 97 | 100 | — | — | — | MAn | 6 | 1.4 | 1.35 | A |
| 4 | 95 | — | 100 | — | — | NAn | 10 | 1.9 | 1.29 | A |
| 5 | 95 | 90 | — | MXDA | 10 | CAn | 10 | 2.0 | 1.38 | A |
| 6 | 95 | 25 | 25 | MXDA | 50 | MAn | 8 | 2.2 | 1.45 | A |
| Comparative Example | | | | | | | | | | |
| 1 | 100 | — | — | ODA | 100 | — | — | 5.7 | — | — |
| 2 | 100 | — | — | DCHM | 100 | — | — | 6.5 | 0.65 | C |
| 3 | 100 | 100 | — | — | — | — | — | 1.6 | 0.62 | A |
| 4 | 100 | — | 100 | — | — | — | — | 2.2 | 0.80 | A |
| 5 | 95 | — | — | DCHM | 100 | NAn | 10 | 6.0 | 0.73 | C |
| 6 | 95 | 100 | — | — | — | PAn | 10 | 1.4 | 0.20 | C |

INDUSTRIAL APPLICABILITY

Since the polyimide resin of the present invention has satisfactory solvent solubility and thermosetting properties and has excellent adhesive properties, heat resistance and low water absorption properties, it is favorably used for a polyimide resin film, an adhesive and a metal-clad laminate using the subject adhesive. Also, the subject metal-clad laminate is favorably processed into a printed wiring board, a surface heating element, an electromagnetic shielding material, a flat cable, etc.

The invention claimed is:

1. A polyimide resin containing at least one kind selected from the group consisting of a repeating unit represented by the following formula (1) and a repeating unit represented by the following formula (2):

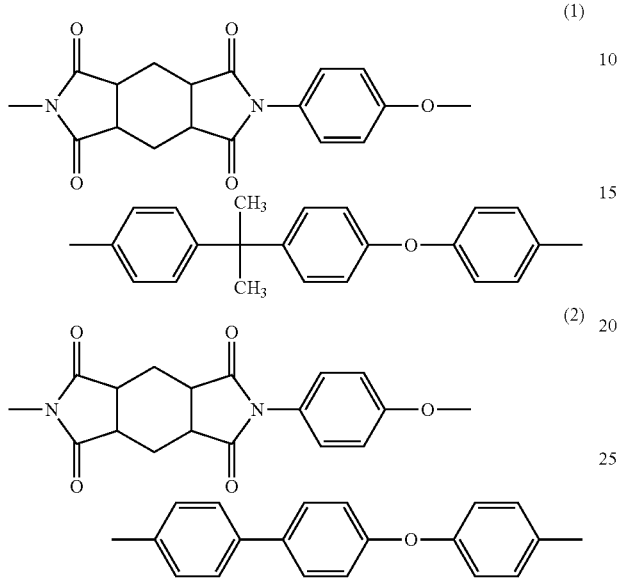

or a polyimide resin containing at least one kind selected from the group consisting of a repeating unit represented by the formula (1) and a repeating unit represented by the formula (2) and at least one kind of a repeating unit other than the repeating unit represented by the formula (1) or (2), which is represented by the following formula (3):

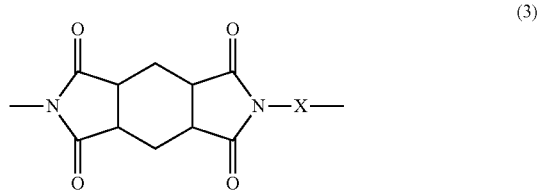

(in the formula, X represents a divalent aliphatic group having from 2 to 39 carbon atoms, a divalent alicyclic group having from 3 to 39 carbon atoms, a divalent aromatic group having from 6 to 39 carbon atoms or a divalent group composed of a combination thereof; at least one kind of a bonding group selected from the group consisting of —O—, —$SO_2$—, —$CH_2$—, —$C(CH_3)_2$—, —$OSi(CH_3)_2$—, —$C_2H_4O$— and —S— may intervene in a main chain of X; and X may have at least one kind of a functional group selected from the group consisting of a carboxyl group, a hydroxyl group and a carbonyl group), wherein a proportion of the total sum of the repeating unit represented by the formula (1) and the repeating unit represented by the formula (2) is 50% by mole or more of the whole of the repeating units; and the polyimide resin contains a material obtained by reacting an end-capping component (W) which is 5-norbornene-2,3-dicarboxylic anhydride on a molecular end thereof, and wherein the polyimide resin is obtained by reacting a tetracarboxylic acid component (Y), a diamine component (Z) and said end-capping component (W), the polyimide resin being prepared in a ratio of from 0.8 to 0.98 moles for the tetracarboxylic acid component (Y) and from 0.4 to 0.02 moles for the end-capping component (W), respectively, per mole of the diamine component (Z), and the sum of the tetracarboxylic acid component (Y) and a half of the end-capping component (W) does not exceed one mole per mole of the diamine component (Z).

2. The polyimide resin according to claim 1, wherein X in the formula (3) is an m-xylylene group.

3. The polyimide resin according to claim 1, having a coefficient of water absorption of not more than 2.5%.

4. A polyimide resin solution containing the polyimide resin according to claim 1 and an organic solvent.

5. A polyimide resin film containing the polyimide resin according to claim 1.

6. The polyimide resin according to claim 1, which has a logarithmic viscosity, as measured at 30° C. using a 0.5 g/dL solution in N-methyl-2-pyrrolidone, of from 0.15 to 2 dL/g.

7. The polyimide resin solution according to claim 4, wherein said organic solvent is at least one selected from the group consisting of N-methyl-2-pyrrolidone, N,N-dimethylacetamide and γ-butyrolactone.

8. The polyimide resin according to claim 1, wherein said proportion of the total sum of the repeating unit represented by the formula (1) and the repeating unit represented by the formula (2) is 70% by mole or more of the whole of the repeating units.

9. The polyimide resin according to claim 1, wherein said proportion of the total sum of the repeating unit represented by the formula (1) and the repeating unit represented by the formula (2) is 80% by mole or more of the whole of the repeating units.

10. The polyimide resin according to claim 1, wherein said ratio is from 0.9 to 0.97 moles for the tetracarboxylic acid component (Y), and from 0.2 to 0.02 moles for the end-capping component (W), per mole of the diamine component (Z).

* * * * *